United States Patent
Yang et al.

(10) Patent No.: US 10,476,041 B2
(45) Date of Patent: Nov. 12, 2019

(54) METHOD FOR MANUFACTURING OLED PANEL

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Tao Yang, Beijing (CN); Wei Song, Beijing (CN); Zenghong Li, Beijing (CN); Peng Chen, Beijing (CN); Lin Liu, Beijing (CN); Yonghong Zhang, Beijing (CN); Ling Tong, Beijing (CN); Yaorong Liu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 22 days.

(21) Appl. No.: 15/550,755

(22) PCT Filed: Jan. 23, 2017

(86) PCT No.: PCT/CN2017/072182
§ 371 (c)(1),
(2) Date: Aug. 11, 2017

(87) PCT Pub. No.: WO2017/206531
PCT Pub. Date: Dec. 7, 2017

(65) Prior Publication Data
US 2018/0233704 A1    Aug. 16, 2018

(30) Foreign Application Priority Data
Jun. 3, 2016 (CN) .......................... 2016 1 0390929

(51) Int. Cl.
*H01L 21/00* (2006.01)
*H01L 51/56* (2006.01)
(Continued)

(52) U.S. Cl.
CPC .............. *H01L 51/56* (2013.01); *H01L 27/32* (2013.01); *H01L 51/5237* (2013.01); *H01L 51/5246* (2013.01); *H01L 2251/566* (2013.01)

(58) Field of Classification Search
CPC ..... H01L 51/56; H01L 27/32; H01L 51/5237; H01L 51/5246
See application file for complete search history.

(56) References Cited

U.S. PATENT DOCUMENTS

| 2007/0222937 A1 | 9/2007 | Lee et al. |
| 2015/0084055 A1 | 3/2015 | Nagata et al. |

(Continued)

FOREIGN PATENT DOCUMENTS

| CN | 101574758 A | 11/2009 |
| CN | 202332975 U | 7/2012 |

(Continued)

OTHER PUBLICATIONS

Chinese Rejection Decision, for Chinese Patent Application No. 201610390929.9, dated Dec. 8, 2017, 7 pages.
(Continued)

*Primary Examiner* — Richard A Booth
(74) *Attorney, Agent, or Firm* — Kinney & Lange, P.A.

(57) ABSTRACT

A method for manufacturing an OLED panel is provided by embodiments of the present disclosure, including following steps of: manufacturing an OLED motherboard which comprises a plurality of OLED panel areas spaced apart from one another, each comprising a display region and a frit package region which is located on a periphery of the display region and is to encapsulate the display region by a frit; and cutting
(Continued)

the OLED motherboard along a cutting line to obtain separated OLED panels; and the cutting line is located within the frit package region and at a predetermined distance inwards from an edge of the periphery of the frit package region.

14 Claims, 6 Drawing Sheets

(51) Int. Cl.
*H01L 27/32* (2006.01)
*H01L 51/52* (2006.01)

(56) References Cited

U.S. PATENT DOCUMENTS

| | | | |
|---|---|---|---|
| 2015/0102304 A1* | 4/2015 | Go | H01L 51/5246 257/40 |
| 2016/0037639 A1 | 2/2016 | Oh | |
| 2016/0181230 A1 | 6/2016 | Li | |

FOREIGN PATENT DOCUMENTS

| | | |
|---|---|---|
| CN | 103207480 A | 7/2013 |
| CN | 104576698 A | 4/2015 |
| CN | 204463733 U | 7/2015 |
| CN | 105932168 A | 9/2016 |
| EP | 2023421 A2 | 2/2009 |

OTHER PUBLICATIONS

Second Chinese Office Action, for Chinese Patent Application No. 201610390929.9, dated May 9, 2018, 13 pages.
Extended European Search Report dated Sep. 7, 2018, for corresponding European Application No. 17746363.5.
International Search Report and Written Opinion dated May 2, 2017, for corresponding PCT Application No. PCT/CN2017/072182.
First Chinese Office action dated Apr. 25, 2017 for corresponding Chinese Application No. 2016103909299.

* cited by examiner

METHOD FOR MANUFACTURING OLED PANEL

CROSS-REFERENCE TO RELATED APPLICATION

This application claims the benefit of Chinese Patent Application No. 201610390929.9 filed on Jun. 3, 2016 in the State Intellectual Property Office of China, the whole disclosure of which is incorporated herein by reference.

BACKGROUND OF THE INVENTION

Field of the Invention

Embodiments of the present disclosure relate to a method for manufacturing an OLED (Organic Light-Emitting Device), especially relate to a method for manufacturing an OLED panel having a slim bezel.

Description of the Related Art

Nowadays, the OLED display panel functions as a new type of display panels, and has been extensively used in display apparatus due to its advantages, such as active luminescence, excellent temperature property, relatively small power consumption, quick response, flexible/bendable and ultra-slim characteristics, and relatively low cost and the like.

Typically, processes of manufacturing an OLED panel comprises: above all, forming an OLED motherboard which has a relatively large dimension and comprises a plurality of OLED panel areas spaced apart from one another, each comprising a display region and a frit package region which is located on a periphery of the display region and is to encapsulate the display region by a frit; and then, cutting the OLED motherboard along cutting lines which are distributed among the plurality of OLED panel areas so as to obtain OLED panels each of which is dimensioned as desired. Each of the OLED panels thus produced comprises the display region and a bezel region in addition to the display region.

Since a display function of the OLED panel is achieved mainly by the display region while the bezel region is mainly used for implementing auxiliary properties, e.g., panel package, then, in consideration of aesthetics and cost and the like, the smaller the bezel is manufactured the better its effect is in theory, so as to obtain a design of a slim bezel. However, due to a limitation of processes of related apparatus, aforementioned conventional methods for manufacturing an OLED panel fail to further decrease a width of the bezel region of a final product of the OLED panel thus produced. Moreover, in order to ensure that a reliability level of the OLED panel is qualified, there is an obstacle for realizing a design of slim bezel by decreasing a width of the frit package region.

SUMMARY OF THE INVENTION

Embodiments of the present disclosure have been made to overcome or alleviate at least one aspect of the above mentioned disadvantages and/or shortcomings, by providing a method for manufacturing an OLED panel.

Following technical solutions are adopted in exemplary embodiments of the invention for achieving the above desired technical purposes.

According to an aspect of the exemplary embodiment of the present disclosure, there is provided a method for manufacturing an OLED panel, comprising following steps of:

manufacturing an OLED motherboard which comprises a plurality of OLED panel areas spaced apart from one another, each comprising a display region and a frit package region which is located on a periphery of the display region and is to encapsulate the display region by a frit; and cutting the OLED motherboard along a cutting line to obtain separated OLED panels, wherein the cutting line is located within the frit package region and at a distance inwards from an edge of the periphery of the frit package region.

According to an embodiment of the disclosure, in above method for manufacturing the OLED panel, the cutting line is located within the frit package region and in parallel with the edge of the periphery of the frit package region, and the distance is a first distance which is not more than 150 μm.

According to an embodiment of the disclosure, in above method for manufacturing the OLED panel, the distance is a first distance which is 100 μm.

According to an embodiment of the disclosure, in above method for manufacturing the OLED panel, a thickness of the frit is in a range of 5~6.5 μm at a distance of 100 μm inwards from the edge of the periphery of the frit package region.

According to an embodiment of the disclosure, in above method for manufacturing the OLED panel, a thickness of the frit is 5.5 μm at a distance of 100 μm inwards from the edge of the periphery of the frit package region.

According to an embodiment of the disclosure, in above method for manufacturing the OLED panel, a width of the frit package region is in a range of 350~600 μm.

According to an embodiment of the disclosure, in above method for manufacturing the OLED panel, the OLED motherboard is cut by a cutting wheel so as to obtain the separated OLED panels.

According to an embodiment of the disclosure, in above method for manufacturing the OLED panel, a cutting speed of the cutting wheel is in a range of 100~300 mm/s.

According to an embodiment of the disclosure, in above method for manufacturing the OLED panel, there is an additional step of preheating the frit along the cutting line, followed by the step of cutting the OLED motherboard along the cutting line.

According to an embodiment of the disclosure, in above method for manufacturing the OLED panel, the step of preheating the frit along the cutting line comprises preheating the frit by laser.

According to an embodiment of the disclosure, in above method for manufacturing the OLED panel, the step of manufacturing the OLED motherboard comprises:

manufacturing a first substrate and a second substrate, one of which is an OLED substrate while the other of which is a package substrate, with the frit package region being provided on both the first substrate and the second substrate;

applying the frit onto the frit package region on at least one of the first substrate and the second substrate;

aligning and adhering the first substrate and the second substrate against each other; and bonding the first substrate and the second substrate together by curing the frit so as to form the OLED motherboard.

According to an embodiment of the disclosure, in above method for manufacturing the OLED panel, the cutting line is located within the frit package region and provided at an angle with the edge of the periphery of the frit package region and located such that the distance at which each point thereon is provided inwards from the edge of the periphery of the frit package region is a second distance which is larger than 0 but less than a width of the frit package region.

According to an embodiment of the disclosure, in above method for manufacturing the OLED panel, the second distance at which each point on the cutting line is provided inwards from the edge of the periphery of the frit package region is larger than 0 but not more than a distance threshold set as 150 μm.

According to an embodiment of the disclosure, in above method for manufacturing the OLED panel, the second distance is not less than 100 μm but less than the distance threshold.

BRIEF DESCRIPTION OF THE DRAWINGS

The above and other features and advantages of the present disclosure will become more apparent and a more comprehensive understanding of the present disclosure may be obtained, by describing in detail exemplary embodiments disclosure thereof with reference to the accompanying drawings, in which.

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the expression "provided . . . above . . . " may mean that one component is provided directly on another component, or alternatively mean that one component is provided over another component with an intermediate layer being provided therebetween.

Respective dimension and shape of each component in the drawings are only intended to exemplarily illustrate the contents of the disclosure, rather than to demonstrate the practical dimension or proportion of components of the OLED panel.

Figure 1:
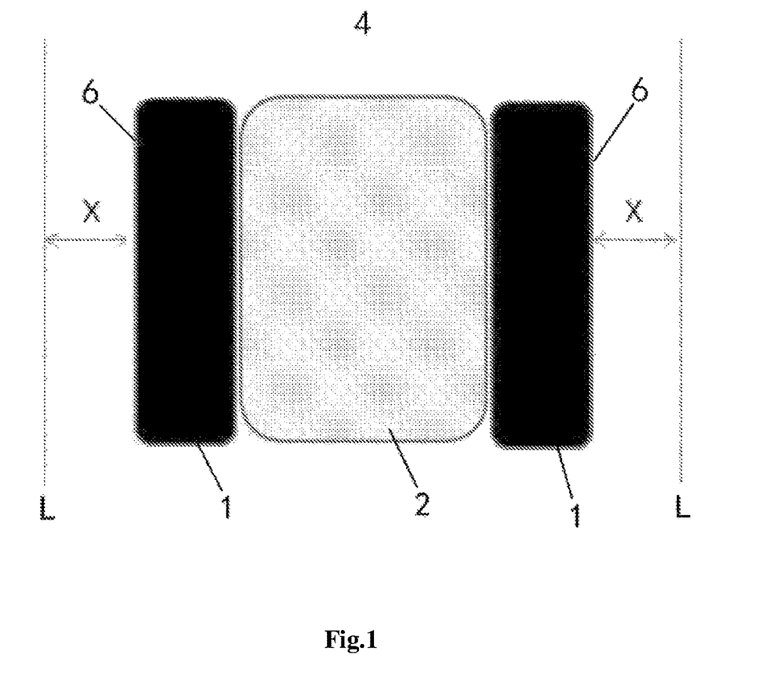
FIG. 1 illustrates a schematic view of a cutting step of the method for manufacturing an OLED panel.

FIG. 1 illustrates a cutting step of the method for manufacturing the OLED panel. It should be noticed that, FIG. 1 only illustrates a portion of an OLED motherboard which has a relatively large dimension. The OLED motherboard generally comprises a plurality of OLED panel areas which are spaced apart from one another, each comprising a display region and a frit package region which is located on a periphery of the display region and is to encapsulate the display region by a frit. In an embodiment as illustrated in FIG. 1, only one exemplary OLED panel area of the OLED motherboard is shown exemplarily. As illustrated therein, the OLED panel area of the OLED motherboard 4 comprises a display region 2 and a frit package region 1 which is located on the periphery of the display region 2 and is to encapsulate the display region by a frit. By way of example, the OLED motherboard 4 is cut along a cutting line L which is located at a distance X from the frit package region 1 of the display panel. Specifically, the cutting line L is located outside the frit package region 1 and is at a distance X from an edge 6 of the periphery of the frit package region 1.

For example, in order to decrease a slim region of a final product of the OLED panel, there is one solution by decreasing the distance X between the cutting line L and the frit package region 1. However, due to restrictions of related apparatus, currently, the distance X between the cutting line L and the frit package region 1 is set to a relatively low value which reaches a limitation of processes of related apparatus; therefore, a slim which is narrower may not be obtained by further decreasing the distance X. And there is also another solution by decreasing a width of the frit package region 1 itself. However, in case that the width of the frit package region is excessively narrow, the reliability level of the OLED panel may not be qualified; therefore, there is also an obstacle for realizing a design of slim bezel by decreasing a width of the frit package region itself.

Figure 2:
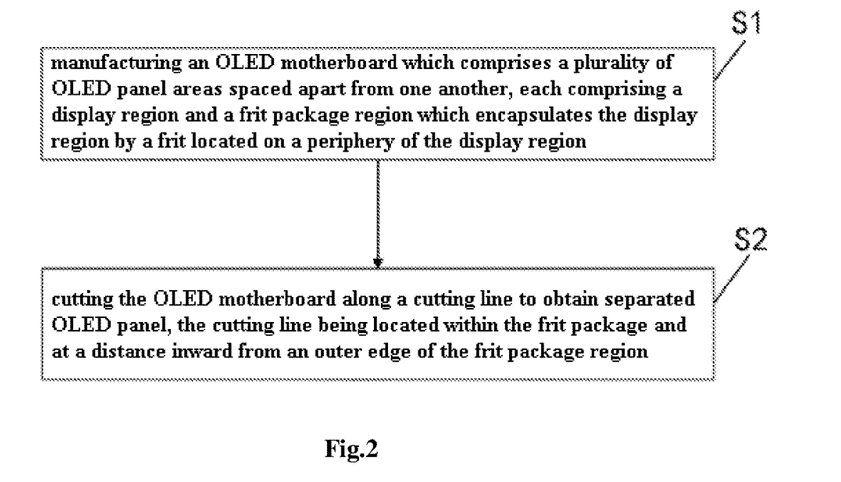
FIG. 2 illustrates a flow chart of the method for manufacturing the OLED panel according to an exemplary embodiment of the disclosure.
Figure 3A:
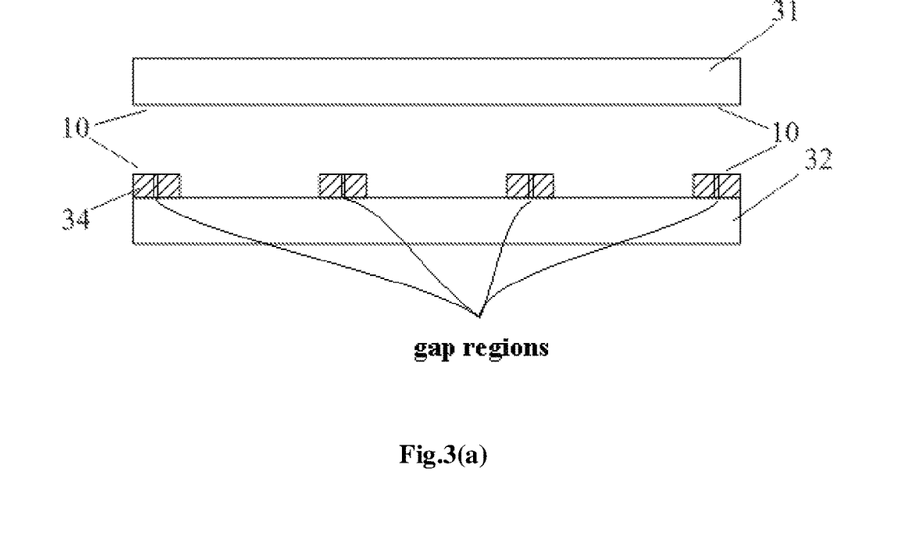
FIG. 3(a) illustrates a schematic view of a structure formed after a portion of a step of manufacturing an OLED motherboard, according to an exemplary embodiment of the disclosure.
Figure 3B:
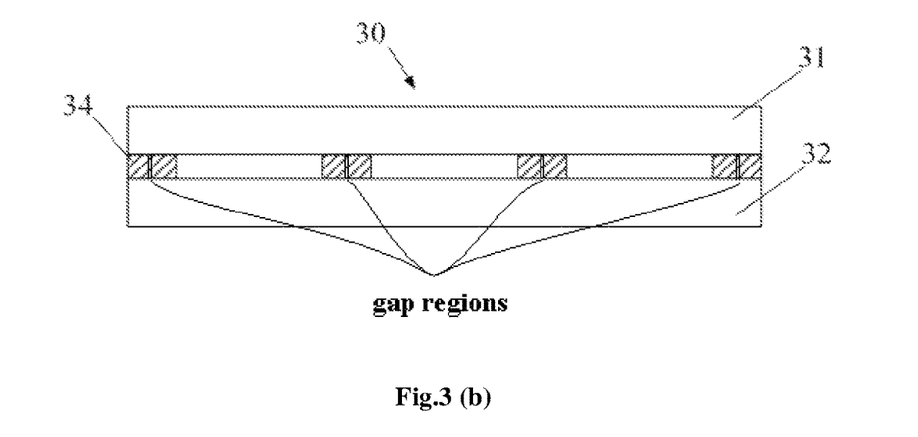
FIG. 3(b) illustrates a schematic view of a structure formed after the other portion of the step of manufacturing the OLED motherboard, according to an exemplary embodiment of the disclosure.
Figure 4:
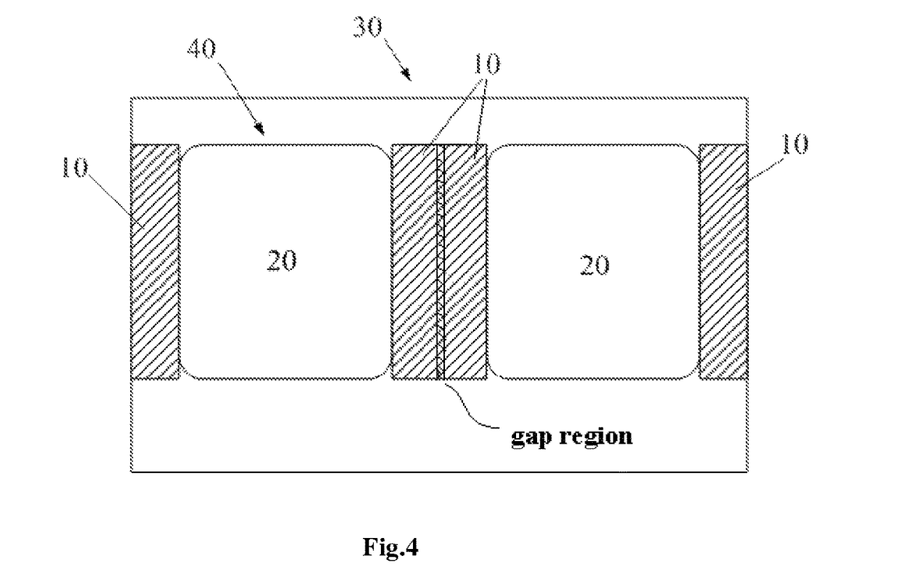
FIG. 4 illustrates a structural schematic view of the OLED motherboard formed by the method according to an exemplary embodiment of the disclosure.
Figure 5:
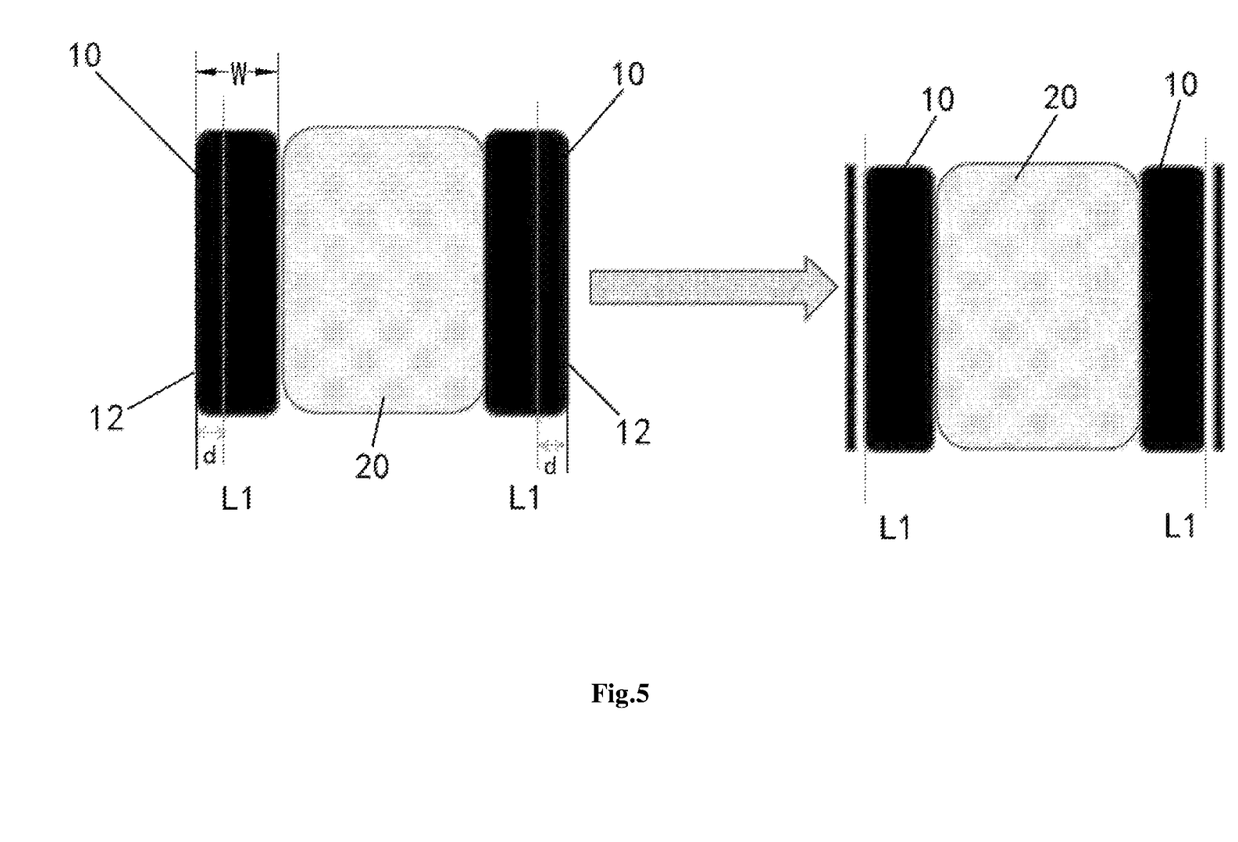
FIG. 5 illustrates a schematic view of a cutting step in the method for manufacturing the OLED panel according to an exemplary embodiment of the disclosure.

Therefore, yet another method for manufacturing the OLED panel is provided by embodiments of the disclosure, as illustrated in FIGS. 2~5. FIG. 2 illustrates a flow chart of the method for manufacturing the OLED panel according to an exemplary embodiment of the disclosure; FIG. 3(a) illustrates a schematic view of a structure formed after a portion of a step of manufacturing an OLED motherboard, according to an exemplary embodiment of the disclosure; FIG. 3(b) illustrates a schematic view of a structure formed after the other portion of the step of manufacturing the OLED motherboard, according to an exemplary embodiment of the disclosure; FIG. 4 illustrates a structural schematic view of the OLED motherboard formed by the method according to an exemplary embodiment of the disclosure; and FIG. 5 illustrates a schematic view of a cutting step in the method for manufacturing the OLED panel according to an exemplary embodiment of the disclosure. Then an exemplary embodiment of the method for manufacturing the OLED Panel may be set forth in detail as follows, referring to FIGS. 2~5.

According to a general technical concept of the present disclosure, as illustrated in FIG. 2, there is provided a method for manufacturing an OLED panel, comprising following steps:

S1: manufacturing an OLED motherboard which comprises a plurality of OLED panel areas spaced apart from one another, each comprising a display region and a frit package region which is located on the periphery of the display region and is to encapsulate the display region by a frit; and S2: cutting the OLED motherboard along a cutting line to obtain separated OLED panels, the cutting line being located within the frit package and at a predetermined distance inwards from an edge of the periphery of the frit package region.

In an embodiment of the disclosure, in the step S1, by way of example, the step of manufacturing the OLED motherboard comprises:

manufacturing a first substrate and a second substrate;

coating/applying the frit onto the frit package region on at least one of the first substrate and the second substrate;

aligning and adhering the first substrate and the second substrate against each other; and bonding the first substrate and the second substrate together by curing the frit so as to form the OLED motherboard.

As set forth herein, by way of example, the first substrate is an OLED substrate while the second substrate is a package substrate. The frit is applied onto a region to be encapsulated in addition to the display region on the OLED substrate, and may alternatively be applied onto a corresponding region to be encapsulated on the package substrate, which corresponding region to be encapsulated is arranged to align and overlap the region to be encapsulated of the OLED substrate. The regions to be encapsulated may for example be packaged by the frit, i.e., alternatively be referred to as the frit package region hereinafter. Once the frit is applied, the first substrate and the second substrate are aligned with each other and adhered against each other. Next, the locations on the first substrate and the second substrate corresponding to the frit package region are irradiated by laser such that the frit are melted and cured, so as to bond the first substrate and the second substrate together. As such, the package of both of the first substrate and the second substrate are implemented, so as to form the OLED motherboard.

As illustrated in FIG. 3(a), in the step S1, the first substrate 31 and the second substrate 32 are manufactured. By way of example, one of the first substrate 31 and the second substrate 32 is an OLED substrate while the other of the first substrate 31 and the second substrate 32 is a package substrate, with the frit package region 10 being provided on both the first substrate 31 and the second substrate 32. And the frit 34 is applied onto the frit package region 10 which is provided on one of the first substrate 31 and the second substrate 32. Then, as illustrated in FIG. 3(b), the first substrate 31 and the second substrate 32 are aligned and adhered against each other. And the frit 34 is in turn melted and cured by irradiation of laser so as to bond the first substrate 31 and the second substrate 32 together so as to form the OLED motherboard 30. As such, the OLED motherboard 30 comprises a plurality of OLED panel areas 40 spaced apart from one another, each OLED panel area 40 comprising a display region 20 and a frit package region 10 which is located on the periphery of the display region and is to encapsulate the display region by a frit, as illustrated in FIG. 4.

In the step S2, by way of example, the OLED motherboard is cut by a cutting wheel along a cutting line located within the frit package region so as to divide the plurality of OLED panel areas which are spaced apart to get separated OLED panels. A cutting speed of the cutting wheel is for example in a range of 100~300 mm/s.

FIG. 5 illustrates a schematic view of a cutting step in the method for manufacturing the OLED panel according to an exemplary embodiment of the disclosure. In combination of FIG. 4 and FIG. 5, the display panel area comprises the frit package region 10 and the display region 20. In the step S2, the OLED motherboard 30 is cut along the cutting line L1 which is located within the frit package region 10 and is for example provided in parallel with an edge 12 of the periphery of the frit package region 10 and/or an edge of the display region 20 which is arranged most adjacent thereto, at a first distance d inwards from the edge 12 of the periphery of the frit package region 10. The expression 'inwards' herein means in a direction which points towards a display region 20 which is most adjacent to the cutting line L1. Although in FIGS. 4 and 5, the frit package region 10 is shown to be located on both sides of the display region 20, the frit package region 10 is for example configured to surround the display region 20.

It is found by experiments that, a choice of positions of the cutting line L1 may influence both cutting effect and encapsulating effect significantly. Once the frit package region 10 is cut at a first distance d inwards from the edge of the periphery thereof, both cutting effect and encapsulating effect may be ensured. However, in case that the frit package region 10 is cut at other positions, there may be some faulty phenomena which occur on the first substrate and/or the second substrate which may be a glass substrate, such as serious cracks, breakage, or failure in cutting-off and the like, such that the requirements of a package test may not be met.

A possible reason for such faulty phenomena may lies in that, at different positions of the frit package region, levels of curing between the frit and the glass substrate may vary and a thickness of the frit may also vary, such that magnitudes of stresses at different positions on the glass substrate vary. Therefore, by selecting a particular position on the frit at which the cutting is carried out, a failure in cutting and a failure in package may be avoided.

According to an embodiment of the disclosure, it is founded that, in case that the first distance d is not more than a distance threshold which is set as 150 µm, for example, a superior cutting effect may be implemented and requirements on properties of the package of the OLED panel may also be met simultaneously.

According to another embodiment of the disclosure, once the cutting is carried out at a distance of 100 µm inwards from the edge 12 of the periphery of the frit package region 10, i.e., in case that the first distance d is set as 100 µm, both a superior cutting effect and a superior package effect may be implemented.

Furthermore, in case that at a distance of 100 µm inwards from the edge 12 of the periphery of the frit package region 10, the thickness of the frit is in a range of 5~6.5 µm, especially the thickness is 5.5 µm, both a superior cutting effect and a superior package effect may be implemented.

According to still another embodiment of the disclosure, a width of the frit package region 10, which is indicated as 'W' in FIG. 5, may be selected to be in a range of 350~600 μm.

As an alternative embodiment of the disclosure, for example, in the step S2, the OLED motherboard is cut along the cutting line L1 which is located within the frit package region 10 and may for example be provided at an angle with the edge 12 of the periphery of the frit package region 10 and/or an edge of the display region 20 which is arranged most adjacent thereto, such that the distances where all points on the cutting line L1 may be located inwards from the edge 12 of the periphery of the frit package region 10 are second distances, which are all larger than zero but less than the width W of the frit package region 10. Furthermore, by way of example, the second distances are all larger than zero but less than or equal to the distance threshold 150 μm. Moreover, by way of example, the second distances are all larger than or equal to 100 μm but less than the distance threshold 150 μm.

The OLED panels manufactured by above embodiments may be subjected to a reliability tests, comprising a PCT test, a THS test and a peel-off test, with the results of these tests listed in the table 1 as below.

The PCT test refers to a test for a package property of the OLED panel against an aqueous vapor in a certain condition of high temperature, moisture, and high pressure. The THS test refers to a test for a package property of the OLED panel against an aqueous vapor in a certain condition of high temperature and moisture. And the peel-off test refers to a test for measuring a maximum load (in kgf) of the OLED panel once both upper and lower substrates are peeled off the OLED panel, when a glue is applied at tops and bottoms of four corners of the OLED panel, followed by a 24-hour standing and waiting, in case that a specialized device is used to apply forces simultaneously in both upward and downward directions on the OLED panel.

required. Meanwhile, during the cutting, the OLED panel is provided with a superior cuttability, with a uniformly distributed rib textures in a cutting section thus caused and without apparent cracks.

Therefore, the method for manufacturing the OLED panel according to above embodiments of the disclosure may carry out the cutting process on the frit package region and thus may decrease dimensions of the bezel region of the display panel significantly, so as to meet requirements of a design with a slim bezel. Moreover, the cutting line is located at a predetermined distance inwards from the edge of the periphery of the frit package region so as to reduce defects in cutting effectively and to meet requirements on reliability of the display panel.

It should be noticed that, levels of curing between edge portions and a central portion of the frit package region may differ relatively significantly, with a relatively low levels of curing at the edge portions thereof, a relatively thin thickness of the frit, and a relatively low stress level in the glass substrate. Therefore, it is selected to carry out the cutting process at the first distance or the second distances inwards from the edge of the periphery of the frit package region. Furthermore, depending on different applying way and curing way of the frit, above first distance or the second distances may vary.

According to another embodiment of the disclosure, in order to guarantee both cutting effect and package effect, before the cutting step S2 of the OLED motherboard as illustrated in FIG. 2, the method may for example comprise a step S12, i.e., preheating the frit along the cutting line L1.

Figure 6:
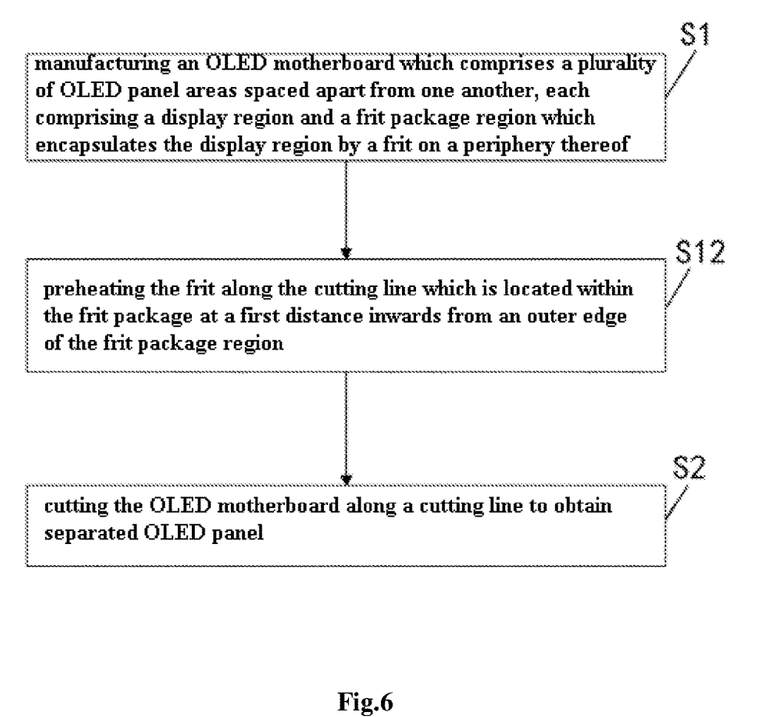
FIG. 6 illustrates a flow chart of the method for manufacturing the OLED panel according to another exemplary embodiment of the disclosure.

Specifically, for example, the step of preheating the frit along the cutting line comprises preheating the frit by laser. As such, internal stresses produced within the glass substrate when the frit is cured may be eliminated, so as to decrease cutting defects effectively upon cutting, and to meet requirements on reliability of the display panel. FIG. 6 illustrates a

TABLE 1

Reliability Tests for the OLED panel

| Test Items | Test Environments | Numbers of tested panels | Evaluation Standards | Test Results |
|---|---|---|---|---|
| PCT Test | Temperature of 120°, Humidity of 100%, 2 atmospheres of pressure, with a test duration of 6 hours | 20 20 20 | Not aqueous vapor entering the panel | First test: Normal Second test: Normal Third test: Normal |
| THS Test | Temperature of 85°, Humidity of 90%, 1 atmosphere of pressure, with a test duration of 240 hours | 20 20 20 | Not aqueous vapor entering the panel | First test: Normal Second test: Normal Third test: Normal |
| Peel-off Test | a maximum load (in kgf) once the OLED panel is peeled off, when a glue is applied at tops and bottoms of four corners of the OLED panel, followed by a 24-hour standing and waiting, in case that a specialized device is used to apply forces simultaneously upwards and downwards | 12 12 12 | Average value > 4 kgf | First test: 4.82 kgf Second test: 4.4 kgf Third test: 4.6 kgf |

Figure 7:
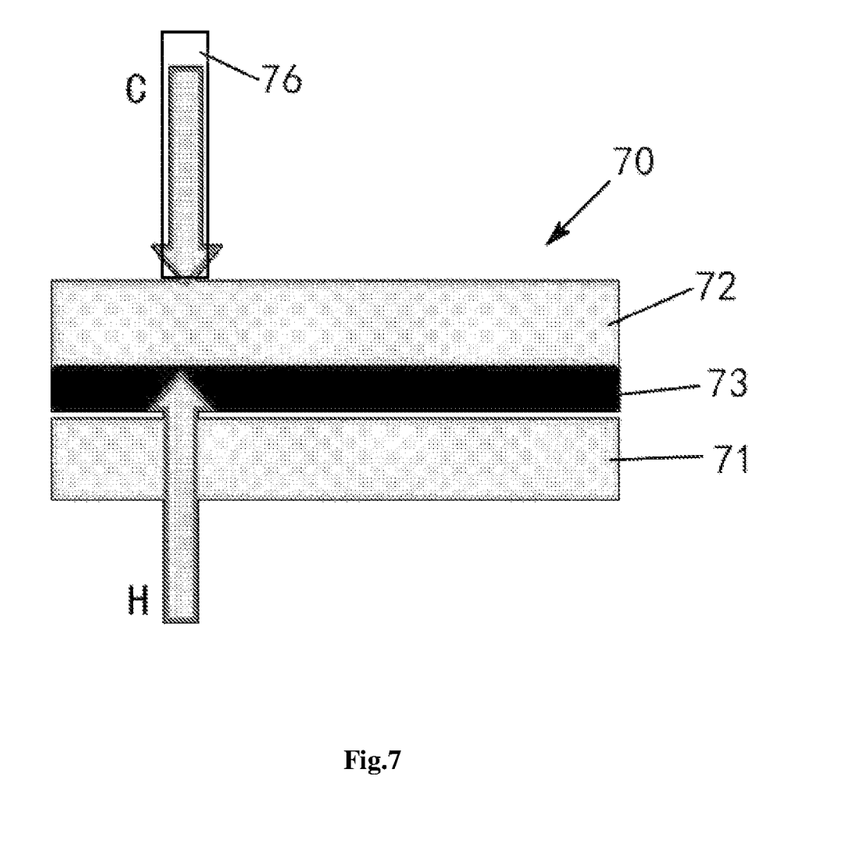
FIG. 7 illustrates a schematic view of preheating and cutting steps in the method for manufacturing the OLED panel according to an exemplary embodiment of the disclosure.

It may be seen from above table 1 that, in all tests, the OLED panels manufactured according to above embodiments have fine package properties and reliability level as flow chart of the method for manufacturing the OLED panel according to another exemplary embodiment of the disclosure; and FIG. 7 illustrates a schematic view of preheating and cutting steps in the method for manufacturing the OLED panel according to an exemplary embodiment of the disclosure.

As such, as illustrated in FIG. 6, the method for manufacturing the OLED panel may for example comprise following steps of:

S1: manufacturing an OLED motherboard which comprises a plurality of OLED panel areas spaced apart from one another, each comprising a display region and a frit package region which is located on the periphery of the display region and is to encapsulate the display region by a frit;

S12: preheating the frit along the cutting line which is located within the frit package at a first distance inwards from an edge of the periphery of the frit package region; and S2: cutting the OLED motherboard along a cutting line to obtain separated OLED panels.

FIG. 7 illustrates a partial sectional view of the OLED motherboard upon cutting along the frit package region. As illustrated in FIG. 7, after the OLED motherboard is manufactured, above all, the frit 73 is preheated by laser from a side of the first substrate 71 below the OLED motherboard 70 along the cutting line, with an arrow H being indicative of a direction of heating by laser. Next, the OLED panel is cut by a cutting wheel 76 along the cutting line on the second substrate 72 above the OLED motherboard 70, with an arrow C being indicative of a direction of cutting by the cutting wheel 76. The first substrate 71 may for example be an OLED substrate while the second substrate 72 may for example be a package substrate. Or otherwise, the first substrate 71 is a package substrate while the second substrate 72 is an OLED substrate. As such, by preheating the frit before the cutting process, by way of example, potential internal stresses within the glass substrate may be eliminated in advance, so as to decrease cutting defects effectively upon cutting and to meet requirements on reliability of the display panel.

The OLED panel manufactured by above method is subjected to the PCT test, the THS test and the peel-off test similar to those listed in the table 1. The OLED panels which pass verification may satisfy requirements on package properties and have a superior cutting effect. Therefore, the reliability of product meets requirements.

Other aspects of embodiments as illustrated in FIGS. 6 and 7 are the same as those as illustrated in FIGS. 2~5, without repeating here once again.

In conclusion, the method for manufacturing the OLED display panel according to embodiments of the disclosure may realize a slim bezel while meeting requirements on reliability of products, such as their package properties and cutting properties.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A method for manufacturing an OLED panel, comprising:
   manufacturing an OLED motherboard which comprises a plurality of OLED panel areas spaced apart from one another, each comprising a display region and a frit package region which is located on a periphery of the display region and is integrally formed into one piece and configured to encapsulate the display region by a frit; and
   cutting the OLED motherboard along a cutting line to obtain separated OLED panels,
   wherein any two adjacent OLED panel areas of the plurality of OLED panel areas are formed to be spaced apart from each other by a gap region located so as to completely occupy outside external edges of respective frit package regions, the gap region being in the form of a void, without any additional frit being contained in the gap region; and
   wherein the cutting line is located within the frit package region and at a distance inwards from an edge of a periphery of the frit package region.

2. The method according to claim 1,
   wherein the cutting line is located within the frit package region and in parallel with the edge of the periphery of the frit package region, and the distance is a first distance which is not more than a distance threshold of 150 μm.

3. The method according to claim 1,
   wherein the distance is a first distance which is 100 μm.

4. The method according to claim 3,
   wherein a thickness of the frit is in a range of 5~6.5 μm at a distance of 100 μm inwards from the edge of the periphery of the frit package region.

5. The method according to claim 3,
   wherein a thickness of the frit is 5.5 μm at a distance of 100 μm inwards from the edge of the periphery of the frit package region.

6. The method according to claim 1,
   wherein a width of the frit package region is in a range of 350~600 μm.

7. The method according to claim 1,
   wherein the OLED motherboard is cut by a cutting wheel so as to obtain the separated OLED panels.

8. The method according to claim 7,
   wherein a cutting speed of the cutting wheel is in a range of 100~300 mm/s.

9. The method according to claim 1, further comprising a step of preheating the frit along the cutting line, followed by the step of cutting the OLED motherboard along the cutting line.

10. The method according to claim 9, wherein the step of preheating the frit along the cutting line comprises preheating the frit by laser.

11. The method according to claim 1, wherein the step of manufacturing the OLED motherboard comprises:
   manufacturing a first substrate and a second substrate, one of which is an OLED substrate while the other of which is a package substrate, with the frit package region being provided on both the first substrate and the second substrate;
   applying the frit onto the frit package region on at least one of the first substrate and the second substrate;
   aligning and adhering the first substrate and the second substrate against each other; and
   bonding the first substrate and the second substrate together by curing the frit so as to form the OLED motherboard.

12. The method according to claim 1, wherein the cutting line is located within the frit package region and provided at an angle with the edge of the periphery of the frit package region and located such that the distance at which each point thereon is provided inwards from the edge of the periphery of the frit package region is a second distance which is larger than 0 but less than a width of the frit package region.

13. The method of claim 12, wherein the second distance at which each point on the cutting line is provided inwards from the edge of the periphery of the frit package region is larger than 0 but not more than a distance threshold set as 150 μm.

14. The method according to claim 13, wherein the second distance is not less than 100 μm but less than the distance threshold.

* * * * *